United States Patent
Kasahara et al.

(10) Patent No.: US 11,677,352 B2
(45) Date of Patent: Jun. 13, 2023

(54) OSCILLATOR AND METHOD OF MANUFACTURING SAME

(71) Applicant: Seiko Epson Corporation, Tokyo (JP)

(72) Inventors: Shoichiro Kasahara, Minowa (JP); Shinya Aoki, Minowa (JP)

(73) Assignee: SEIKO EPSON CORPORATION

(*) Notice: Subject to any disclaimer, the term of this patent is extended or adjusted under 35 U.S.C. 154(b) by 0 days.

(21) Appl. No.: 17/456,186

(22) Filed: Nov. 23, 2021

(65) Prior Publication Data
US 2022/0166378 A1    May 26, 2022

(30) Foreign Application Priority Data

Nov. 24, 2020    (JP) .............................. JP2020-194212

(51) Int. Cl.
*H03B 5/02* (2006.01)
*H03H 9/10* (2006.01)
*H03B 5/32* (2006.01)

(52) U.S. Cl.
CPC ................. *H03B 5/02* (2013.01); *H03B 5/32* (2013.01); *H03H 9/10* (2013.01)

(58) Field of Classification Search
CPC ... H03B 5/02; H03B 5/32; H03H 9/10; H03H 9/0519; H03H 9/0547; H03H 9/1021; H03H 9/19; H03H 9/0538
See application file for complete search history.

(56) References Cited

U.S. PATENT DOCUMENTS

| 8,072,276 B2* | 12/2011 | Harima ................ H03H 9/0561 331/158 |
| 2005/0264140 A1* | 12/2005 | Miyazaki ............. H03H 9/0514 310/344 |
| 2006/0055479 A1* | 3/2006 | Okazaki ................... H03B 5/32 331/158 |

FOREIGN PATENT DOCUMENTS

JP    2011-055033 A    3/2011

* cited by examiner

*Primary Examiner* — Jeffrey M Shin
(74) *Attorney, Agent, or Firm* — Harness, Dickey & Pierce, P.L.C.

(57) ABSTRACT

An oscillator includes a package having a plurality of external terminals disposed on a mounting surface, a circuit element housed in the package, and a resonator which is housed in the package, and is electrically coupled to the circuit element, wherein the circuit element is electrically coupled to the package with a plurality of pads each of which is bonded to the package via a bump member, the circuit element has a rectangular shape in a plan view, and at least three of closest ones to four corners of the circuit element out of the bump members are bonded to the package at respective positions overlapping the plurality of external terminals in the plan view.

9 Claims, 8 Drawing Sheets

OSCILLATOR AND METHOD OF MANUFACTURING SAME

The present application is based on, and claims priority from JP Application Serial Number 2020-194212, filed Nov. 24, 2020, the disclosure of which is hereby incorporated by reference herein in its entirety.

BACKGROUND

1. Technical Field

The present disclosure relates to an oscillator and a method of manufacturing the oscillator.

2. Related Art

There exists an oscillator having a configuration in which an IC is mounted on a package made of a material such as ceramics with an FCB (flip chip bonding) process. In JP-A-2011-055033 (Document 1), there is disclosed an oscillator having such a structure, and a configuration in which external terminals and pads of the IC do not overlap each other in a plan view.

When reducing the size of the oscillator having such a structure as described in Document 1, a distance between the external terminals of the package decreases. When simply decreasing the distance between the external terminals, it is conceivable that a part of the pad of the IC overlaps the external terminal.

However, in the oscillator, the thickness of the package differs depending on whether the external terminal is located on a reverse surface. Therefore, on the mounting surface of the package for the IC, a height difference occurs between the mounting positions of the plurality of pads of the IC. Thus, there is a problem that unevenness occurs in the pressure applied at the positions of the plurality of pads of the IC when bonding the IC and the package to each other using the FCB, and there is a possibility that the performance of the IC deteriorates.

SUMMARY

In view of the problems described above, an oscillator according to the present disclosure includes a package having a plurality of external terminals disposed on a mounting surface, a circuit element housed in the package, and a resonator which is housed in the package, and is electrically coupled to the circuit element, wherein the circuit element is electrically coupled to the package with a plurality of pads each of which is bonded to the package via a bump member, the circuit element has a rectangular shape in a plan view, and at least three of closest ones to four corners of the circuit element out of the bump members are bonded to the package at respective positions overlapping the plurality of external terminals in the plan view.

DESCRIPTION OF EXEMPLARY EMBODIMENTS

Here, some embodiments of the present disclosure will be described in the following order.
(1) First Embodiment:
(1-1) Configuration of Oscillator:
(1-2) Method of Manufacturing Oscillator:
(2) Second Embodiment:
(2-1) Configuration of Oscillator:
(2-2) Method of Manufacturing Oscillator:
(3) Third Embodiment:
(3-1) Configuration of Oscillator:
(3-2) Method of Manufacturing Oscillator:
(4) Other Embodiments:

(1) First Embodiment (1-1) Configuration of Oscillator:

A configuration of an oscillator 1 according to the first embodiment will be described using FIG. 1 and FIG. 2. For the sake of convenience of explanation, it is assumed that the oscillator 1 is disposed on an XYZ coordinate system constituted by an X axis, a Y axis, and a Z axis as three axes perpendicular to each other. The oscillator 1 is disposed so that a height direction becomes parallel to the Z axis setting a mounting surface which is a surface used for coupling to an external board as a bottom part. The oscillator 1 forms a rectangular shape in the plan view, and is disposed so that the long side direction of the rectangular shape becomes parallel to the X axis, and the short side direction thereof becomes parallel to the Y axis. In the X axis, a tip side of the arrow is defined as right or a right side, and a base end side thereof is defined as left or a left side. In the Y axis, a tip side of the arrow is defined as a back side, and a base end side thereof is referred to as a front side. In the Z axis, a tip side of the arrow is referred to as an upper side, and a base end side thereof is defined as a bottom or a lower side.

Figure 1:
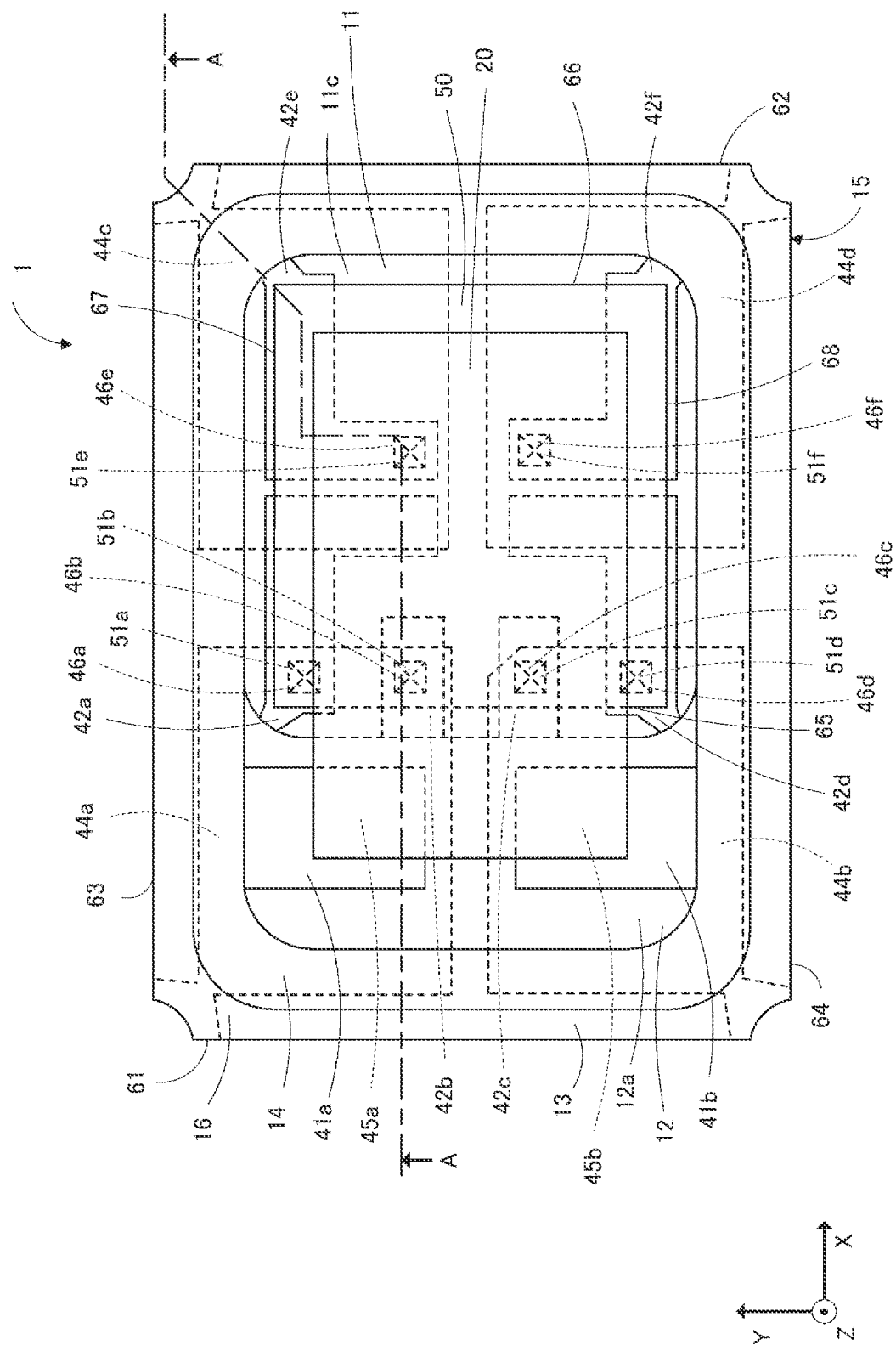
FIG. 1 is a see-through plan view of an oscillator.

FIG. 1 is a see-through plan view of the oscillator 1 viewed from above. A drawing in a plan view of an object viewed from above is hereinafter referred to as a plan view. FIG. 2 is a cross-sectional view of the oscillator 1 shown in FIG. 1 along the line A-A.

The oscillator 1 according to the present embodiment is provided with a container 10, a resonator 20, and an IC 50.

The container 10 is provided with a package 15 and a lid 16. The package 15 is a chassis for housing the resonator 20 and the IC 50. The lid 16 is a lid body which is made of metal and covers an upper surface of the package 15. The plan view shown in FIG. 1 is a plan view of the oscillator 1 seen through the lid 16.

As shown in FIG. 1, the package 15 has a rectangular shape having a first side 61 as a side at the left side, a second side 62 as an opposite side to the first side 61, a third side 63 as a side in an end portion at the back side, and a fourth side 64 as an opposite side to the third side 63 in the plan view.

The resonator 20 is a resonator element using a quartz crystal substrate as a piezoelectric body.

The IC 50 is an integrated circuit element (Integrated Circuit) shaped like a rectangular plate, and is provided with a plurality of pads 51*a* through 51*f* used for electrical coupling to the package 15 on one surface. Hereinafter, the pads 51*a* through 51*f* are arbitrarily referred to collectively as pads 51. As shown in FIG. 1, the IC 50 has a rectangular shape having a fifth side 65 as a left end side located beside the first side 61, a sixth side 66 which is an opposite side to the fifth side 65, and is farther from the first side 61 than the fifth side 65, a seventh side 67 as a side in an end portion at the back side, and an eighth side 68 as an opposite side to the seventh side 67 in the plan view.

A distance (a distance in the X-axis direction) between the first side 61 and the fifth side 65 is longer than a distance between the second side 62 and the sixth side 66.

The pad 51a is a power supply pad to which a power supply voltage is applied. Further, the pad 51b is a first resonator pad to electrically be coupled to the resonator 20. Further, the pad 51c is a second resonator pad to electrically be coupled to the resonator 20. Further, the pad 51d is a control pad to which an output control signal for a clock signal is input.

Further, the pad 51e is a ground pad to be supplied with a ground potential. Further, the pad 51f is an output pad for outputting the clock signal.

Further, a pad group of the pads 51a through 51d is disposed along the fifth side 65 so as to be closer to the fifth side 65 than to the sixth side 66. The pad group disposed along the fifth side 65 so as to be closer to the fifth side 65 than to the sixth side 66 is defined as a first pad group. The pads 51a through 51d are disposed at positions the same in the X-axis direction. It should be noted that the pads 51 in the first pad group can be disposed at positions different in the X-axis direction from each other. Further, some of the pads in the first pad group can be disposed at positions the same in the X-axis direction.

Further, a pad group of the pads 51e and 51f is disposed along the sixth side 66 so as to be closer to the sixth side 66 than to the fifth side 65. The pad group disposed along the sixth side 66 so as to be closer to the sixth side 66 than to the fifth side 65 is defined as a second pad group. The pads 51e and 51f are disposed at positions the same in the X-axis direction. It should be noted that the pads 51 in the second pad group can be disposed at positions different in the X-axis direction from each other. Further, some of the pads in the second pad group can be disposed at positions the same in the X-axis direction.

In the present embodiment, a distance on the X axis between the sixth side 66 and the second pad group is longer than a distance on the X axis between the fifth side 65 and the first pad group. In other words, the second pad group is disposed closer to the center of the IC 50 in the X-axis direction than the first pad group.

Figure 2:
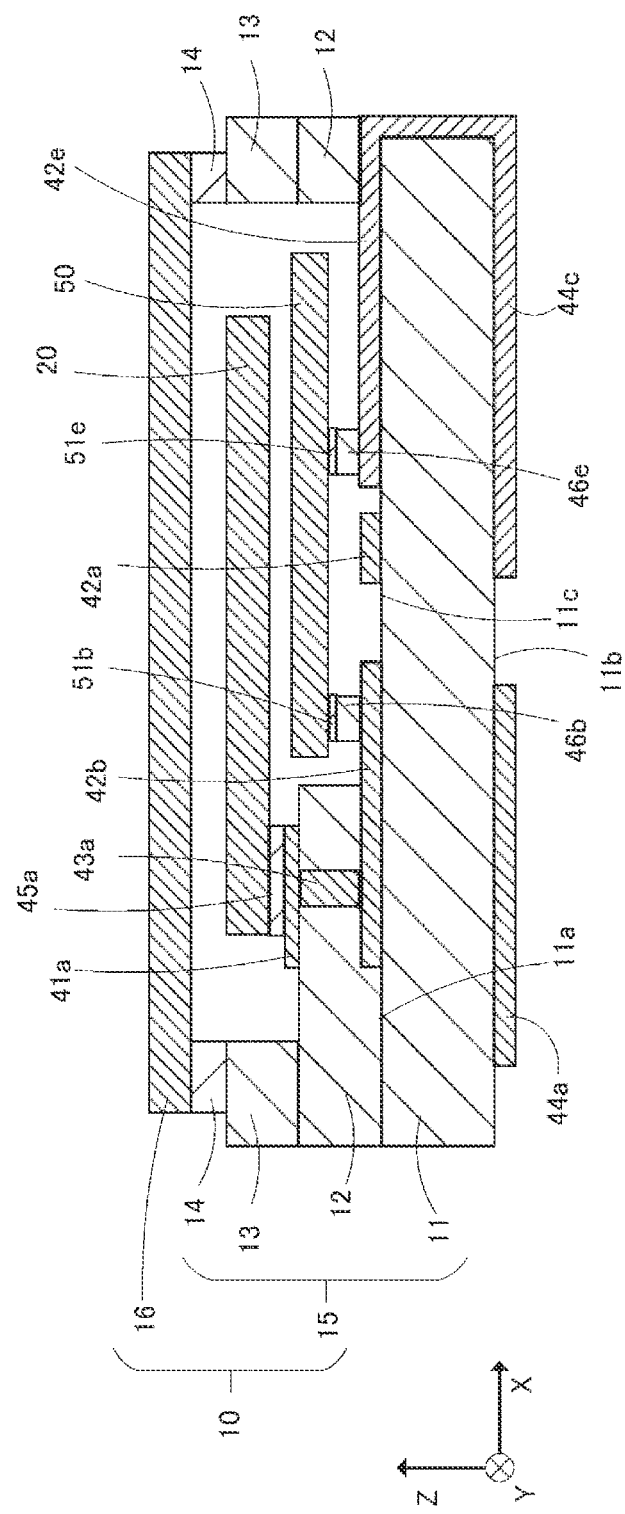
FIG. 2 is a cross-sectional view of the oscillator.

As shown in FIG. 1 and FIG. 2, the package 15 is provided with a substrate 11 forming a bottom part of the package 15, a first frame body 12 as a frame body forming a housing space for the IC 50 and a support base for the resonator 20, a second frame body 13 as a frame body forming a housing space for the resonator 20, and a seam ring 14 as a bonding member to the lid 16. Further, the package 15 is provided with a plurality of coupling interconnections 41a, 41b to be used for coupling to the resonator 20, a plurality of coupling interconnections 42a through 42f to be used for coupling to the IC 50, a via hole 43a to be used for coupling between the coupling interconnection 41a and the coupling interconnection 42b, a via hole 43b not shown to be used for coupling between the coupling interconnection 41b and the coupling interconnection 42c, and a plurality of external terminals 44a through 44d to be used for coupling to the external board. Hereinafter, the coupling interconnections 41a, 41b are arbitrarily referred to collectively as coupling interconnections 41. Further, hereinafter, the coupling interconnections 42a through 42f are arbitrarily referred to collectively as coupling interconnections 42. Further, hereinafter, the via holes 43a, 43b are arbitrarily referred to collectively as via holes 43. Further, hereinafter, the external terminals 44a through 44d are arbitrarily referred to collectively as external terminals 44.

The coupling interconnections 41a, 41b and the resonator 20 are bonded to each other via the bump members 45a, 45b, respectively. Hereinafter, the bump members 45a, 45b are arbitrarily referred to collectively as bump members 45. As shown in FIG. 2, the bump member 45a is located between the coupling interconnection 41a and the resonator 20. Similarly, the bump member 45b is located between the coupling interconnection 41b and the resonator 20. The coupling interconnections 42a through 42f and the pads 51a through 51f are bonded to each other via the bump members 46a through 46f, respectively. Hereinafter, the bump members 46a, 46b are arbitrarily referred to collectively as bump members 46.

In the substrate 11, a surface at an obverse side is defined as a first surface 11a, and an opposite surface to the first surface 11a to be a surface at a reverse side is defined as a second surface 11b. In the present embodiment, the substrate 11 is a substrate made of ceramics. The substrate 11 can be a substrate made of a substrate material having an insulating property such as glass or resin, or a substrate material having an insulating property obtained by combining these materials.

On the four corners of the second surface 11b as a bottom surface of the substrate 11, there are disposed the external terminals 44a through 44d, respectively. The external terminals 44a through 44d are disposed respectively on an upper left corner, a lower left corner, an upper right corner, and a lower right corner of the second surface 11b in the plan view. The external terminals 44a through 44d are each a metal member provided with a portion shaped like a plate having a surface parallel to an X-Y plane, and a portion extending in a height direction from the corner of the second surface 11b to be coupled to the coupling interconnection 42. The external terminals 44a, 44c, and 44d each have a shape including an area having a rectangular shape, and an area for coupling this area and a corner portion of the second surface 11b to each other. The external terminal 44b has a shape including an area having a rectangular shape in which a corner portion closer to the center of the second surface 11b is cut out, and an area for coupling this area and a corner portion of the second surface 11b to each other in the plan view. As described above, the external terminal 44b out of the external terminals 44a through 44d is different in shape in the plan view from the rest. Thus, it is possible for the user to visually recognize and confirm which terminal corresponds to which one of the external terminals 44a through 44d. It should be noted that providing one of the external terminals 44a through 44d has a shape which can be distinguished from the rest, it is possible to assume that the external terminals 44a through 44d have other shapes. Further, the external terminals 44a through 44d each partially overlap the IC 50 in the plan view.

In the present embodiment, each of the pads 51 is disposed so as to overlap any one of the external terminals 44 in the plan view in the oscillator 1. Specifically, the pads 51a, 51b overlap the external terminal 44a, the pads 51c, 51d overlap the external terminal 44b, the pad 51e overlaps the external terminal 44c, and the pad 51f overlaps the external terminal 44d.

Further, it is assumed that in the present embodiment, the package 15 reduced in size is used in the oscillator 1. Thus, the proportion of the external terminals 44 to the second surface 11*b* becomes higher than when using the package 15 not reduced in size, and as a result, the IC 50 and the external terminals 44*a* through 44*d* overlap each other in the plan view.

The external terminals 44*a*, 44*b* are disposed closer to the first side 61 than to the second side 62 along the first side 61. The external terminal 44*a* is a power supply terminal as a terminal to be supplied with the power supply voltage. The external terminal 44*b* is a control terminal to which a signal for controlling ON/OFF of the clock signal is applied. The external terminals 44*c*, 44*d* are disposed closer to the second side 62 than to the first side 61 along the second side 62. The external terminal 44*c* is an output terminal as a terminal for outputting the clock signal. The external terminal 44*d* is a ground terminal to be supplied with the ground potential.

On the substrate 11, there are stacked the first frame body 12 and the second frame body 13 each having a shape of a picture frame. An inner wall of a left portion of the first frame body 12 protrudes rightward from an inner wall of a left portion of the second frame body 13 to form a step. Here, the shape of a picture frame means a frame shape surrounding a rectangular solid space. A surface which is a portion surrounded by the inner wall of the first frame body 12 in the first surface 11*a*, and on which the IC 50 is disposed is hereinafter defined as an IC arrangement surface 11*c*. Since the distance between the first side 61 and the fifth side 65 is longer than the distance between the second side 62 and the sixth side 66, the IC arrangement surface 11*c* is disposed so as to be shifted rightward on the X axis in the plan view.

Figure 3:
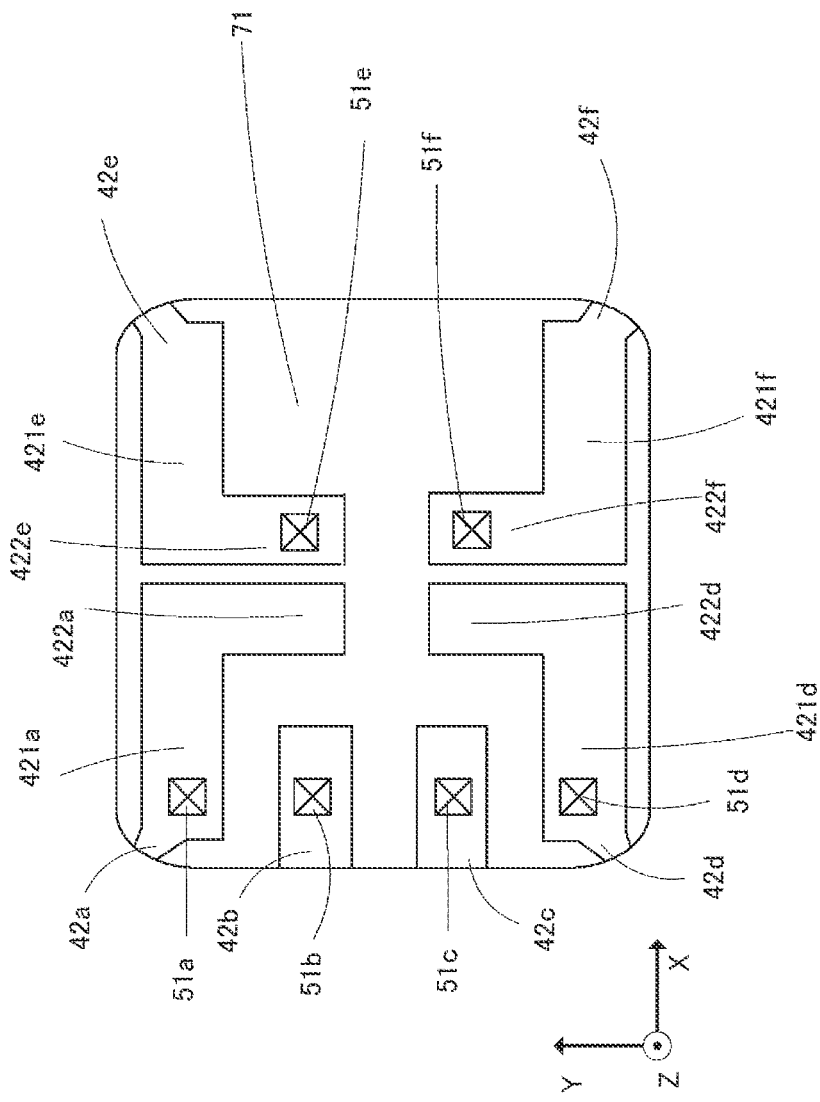
FIG. 3 is a plan view of an IC arrangement surface.

On the IC arrangement surface 11*c*, there are disposed the coupling interconnections 42*a* through 42*f*. The coupling interconnections 42*a* through 42*f* are plate-like metal members used for coupling to the pads 51*a* through 51*f*, respectively. The coupling interconnections 42*a*, 42*d*, 42*e*, and 42*f* each have a shape obtained by combining two elongated portions in the plan view in the IC arrangement surface 11*c*. Further, the coupling interconnections 42*b*, 42*c* each have a rectangular shape in the plan view in the IC arrangement surface 11*c*. FIG. 3 shows the coupling interconnections 42 and the pads 51 disposed on the IC arrangement surface 11*c*.

In the present embodiment, the coupling interconnection 42*a* is a power supply interconnection as an interconnection electrically coupled to the pad 51*a* as the power supply pad. The coupling interconnection 42*a* includes a first portion 421*a* extending rightward from the upper left corner of the IC arrangement surface 11*c* in the plan view, and a second portion 422*a* extending frontward from a right end of the first portion 421*a* in the plan view. The first portion 421*a* is a portion used for coupling between the pad 51*a* as the power supply pad and the external terminal 44*a* as the power supply terminal. Further, the second portion 422*a* is disposed so as to extend between the pad 51*e* as the output pad and the pad 51*b* as the first resonator pad in the plan view.

Further, the coupling interconnection 42*d* is a control interconnection as an interconnection electrically coupled to the pad 51*d* as the control pad. The coupling interconnection 42*d* includes a third portion 421*d* extending rightward from the lower left corner of the IC arrangement surface 11*c* in the plan view, and a fourth portion 422*d* extending backward from a right end of the third portion 421*d*. The third portion 421*d* is used for coupling between the pad 51*d* as the control pad and the external terminal 44*b* as the control terminal. Further, the fourth portion 422*d* is disposed so as to extend between the pad 51*f* as the ground pad and the pad 51*c* as the second resonator pad in the plan view.

Further, the coupling interconnections 42*b*, 42*c* are coupled to the pad 51*b* as the first resonator pad and the pad 51*c* as the second resonator pad, respectively, and each include a portion having a rectangular shape extending rightward from a left end of the IC arrangement surface 11*c* in the plan view. Further, the coupling interconnection 42*e* includes a fifth portion 421*e* which is coupled to the pad 51*e* as the output pad, and extends leftward from the upper right corner of the IC arrangement surface 11*c* in the plan view, and a sixth portion 422*e* extending frontward from a left end of the fifth portion 421*e* in the plan view. Further, the coupling interconnection 42*f* includes a seventh portion 421*f* which is coupled to the pad 51*f* as the ground pad, and extends leftward from the lower right corner of the IC arrangement surface 11*c* in the plan view, and an eighth portion 422*f* extending backward from a left end of the seventh portion 421*f* in the plan view.

The IC 50 is disposed in the IC arrangement surface 11*c* so that the surface provided with the pads 51 is opposed to the IC arrangement surface 11*c*, and the pads 51*a* through 51*f* respectively overlap the coupling interconnections 42*a* through 42*f* in the plan view. The pads 51*a* through 51*f* and the coupling interconnections 42*a* through 42*f* are bonded to each other via the bump members 46*a* through 46*f* as bonding members made of an electrically-conductive material such as solder, respectively, by the flip chip bonding. Since each of the pads 51 is disposed so as to overlap any one of the external terminals 44 in the plan view, each of the bump members 46 is bonded to the package 15 at a position overlapping any one of the external terminals 44 in the plan view.

A portion of the step formed of the first frame body 12, namely a portion which is the upper surface of the first frame body 12, and is surrounded by the inner wall of the second frame body 13, is a portion which functions as the support base for supporting the resonator 20. This portion is hereinafter referred to as a resonator support surface. At the arrangement position of the resonator 20 on the resonator support surface, there is disposed the plurality of coupling interconnections 41*a*, 41*b* to be used for coupling to the resonator 20.

The resonator 20 is electrically coupled to the coupling interconnections 41*a*, 41*b* via the bump members 45*a*, 45*b* as the bonding members made of an electrically-conductive material such as solder, and is fixed to the resonator support surface. The coupling interconnections 41*a*, 41*b* are electrically coupled to the coupling interconnections 42*b*, 42*c* via the via hole 43*a* and the via hole 43*b* not shown penetrating downward the inside of the first frame body 12, respectively.

As described above, the resonator 20 and the IC 50 are housed in a space surrounded by the IC arrangement surface 11*c* as a bottom, and the first frame body 12 and the second frame body 13 each shaped like a picture frame. It should be noted that the material of the first frame body 12 and the second frame body 13 is substantially the same as that of the substrate 11.

In a preferred example, the material of the lid 16 is Kovar (Fe—Ni—Co alloy), and the material of the seam ring 14 is silver solder. The housing space formed inside the package 15 is provided with an inert gas atmosphere with an inert gas such as nitrogen, helium, or argon, or a reduced pressure atmosphere lower in pressure than the atmospheric pressure, and is sealed with the lid 16. Thus, the IC 50, the resonator 20, and so on housed in the housing space are protected against an impact, dust, heat, moisture, and so on. It should be noted that the lid 16 made of metal is grounded at the ground potential.

Figure 4:
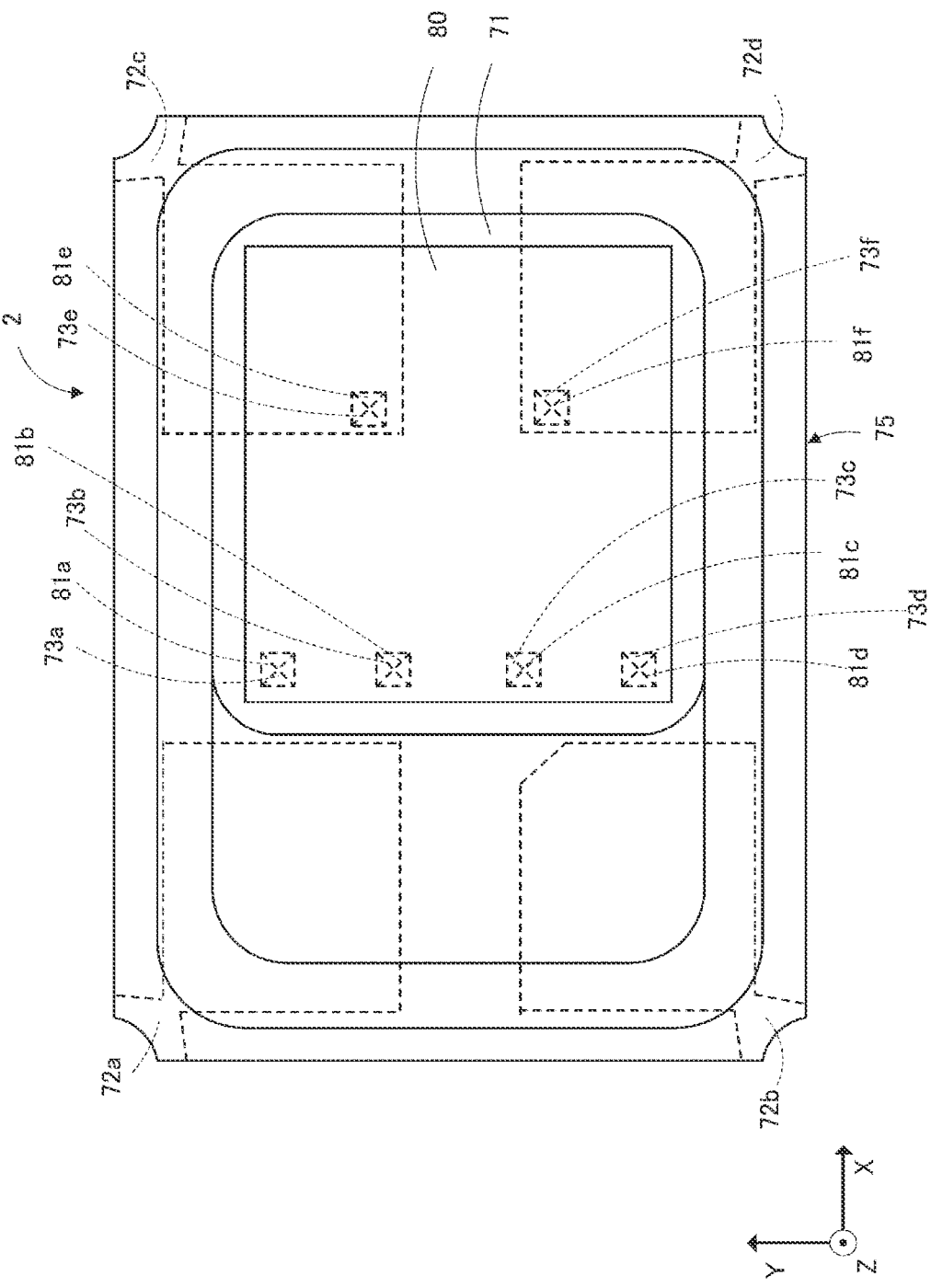
FIG. 4 is a diagram for explaining a structure of an oscillator according to a comparative example.

Here, an oscillator 2 according to a possible comparative example will be described using FIG. 4. FIG. 4 is a diagram for explaining a positional relationship between pads 81*a* through 81*f* of an IC 80 in the oscillator 2 and external terminals 72*a* through 72*d*. FIG. 4 shows the pads 81*a* through 81*f* and the external terminals 72*a* through 72*d* in the plan view in the oscillator 2. Hereinafter, the pads 81*a* through 81*f* are arbitrarily referred to collectively as pads 81. Further, the external terminals 72*a* through 72*d* are arbitrarily referred to collectively as external terminals 72.

As shown in FIG. 4, in the oscillator 2 according to the comparative example, the pads 81*a* through 81*d* do not overlap any one of the external terminals 72 in the plan view similarly to the pads 51*a* through 51*d*. In contrast, the pads 81*e*, 81*f* overlap the external terminals 72*c*, 72*d*, respectively, in the plan view.

Due to an influence of disposing the external terminals 72 on the mounting surface of the oscillator 2, the thickness in the Z-axis direction of the substrate of the package differs between an area in which the external terminals 72 are located on the reverse surface and an area in which the external terminals 72 are not located on the IC arrangement surface 71 of the oscillator 2. Therefore, in the IC arrangement surface 71, there occurs a difference in height between an area overlapping the external terminals 72 and an area not overlapping the terminals 72 in the plan view. Therefore, there occurs a difference in height between the positions on the IC arrangement surface 71 at which the pads 81*a* through 81*f* are respectively located.

When mounting the IC on the package, such operations as described below will be performed. First, the bump members the same in shape are bonded respectively to the pads of the IC. Then, the surface on which the pads of the IC are disposed are made opposed to an upper part of the package, and then the IC is made closer to the IC arrangement surface of the package while keeping the mounting surface of the package and the surface of the IC parallel to each other. When the bumps provided to the pads of the IC and the corresponding coupling interconnections on the IC arrangement surface have contact with each other, by applying a load and an ultrasonic wave between the pads and the corresponding coupling interconnections, the bump members and the corresponding coupling interconnections are bonded to each other.

Figure 5:
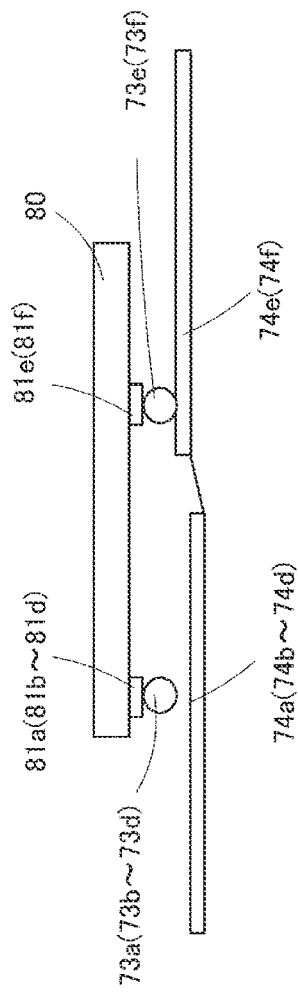
FIG. 5 is a diagram showing a condition when bonding an IC in the comparative example.

When mounting the IC 80 on the package 75 of the oscillator 2 using such operations as described above, there occurs the following. In other words, the IC 80 having the pads 81*a* through 81*f* respectively provided with the bump members 73*a* through 73*f* is made to gradually come closer to the IC arrangement surface 71 of the package 75. Hereinafter, the bump members 73*a* through 73*f* are arbitrarily referred to collectively as bump members 73. First, the bump members 73*e*, 73*f* in the pads 81*e*, 81*f* make contact with the coupling interconnections 74*e*, 74*f* on the IC arrangement surface 71 in advance of the bump members 73*a* through 73*d* in the pads 81*a* through 81*d*. FIG. 5 shows the condition of this case. Then, the IC 80 and the package 75 are made to come closer to each other while keeping the state in which the surface of the IC 80 and the mounting surface of the package 75 are parallel to each other. When all of the bump members 73*a* through 73*f* in the pads 81*a* through 81*f* and the corresponding coupling interconnections 74*a* through 74*f* make contact with each other, then the load and the ultrasonic wave are applied to the portions of the pads 81*a* through 81*f* to bond the IC 80 to the package 75. Hereinafter, the coupling interconnections 74*a* through 74*f* are arbitrarily referred to collectively as coupling interconnections 74.

In such a manner, in the portions of the pads 81*e*, 81*f*, after the bump members 73 and the corresponding coupling interconnections 74 on the IC arrangement surface 71 once make contact with each other, the IC 80 is pressed against the IC arrangement surface 71 until the bump members and the coupling interconnections 74 on the IC arrangement surface 71 make contact with each other in the portions of the pads 81*a* through 81*d* as a result. Thus, higher pressure is applied to the portions of the pads 81*e* through 81*f* than the pressure applied to the portions of the pads 81*a* through 81*d*, and there occurs imbalance in pressure applied when bonding the IC 80 and the package 75 to each other using the flip chip bonding. As a result, there is a possibility that an excessive force is applied to the periphery of the pads 81*e* through 81*f* to deteriorate the performance of the IC 80.

In the oscillator 1 according to the present embodiment, the pads 51*a* through 51*f* each overlap any one of the external terminals 44 in the plan view, and the bump members 46*a* through 46*f* each overlap any one of the external terminals 44 in the plan view. In other words, the arrangement positions of the pads 51*a* through 51*f* in the respective coupling interconnections 42 on the IC arrangement surface 11*c* of the package 15 are the positions at which the external terminals 44 are located on the bottom part. Therefore, the imbalance in height of the arrangement positions of the pads 51*a* through 51*f* in the IC arrangement surface 11*c* is reduced compared to when some of the pads 51*a* through 51*f* overlap any of the external terminals 44 in the plan view. Thus, the pressure applied to the periphery of each of the pads 51*a* through 51*f* when bonding the IC 50 and the package 15 to each other using the flip chip bonding becomes more approximate to the uniform pressure. As a result, it is possible to reduce the possibility that an excessive pressure is applied to the periphery of some of the pads 51*a* through 51*f* to deteriorate the performance of the IC 50.

Further, in the present embodiment, the coupling interconnection 42*a* includes the second portion 422*a* extending between the pad 51*b* and the pad 51*e* in the plan view. The coupling interconnection 42*a* is coupled to the pad 51*a* as the power supply pad, and is supplied with a DC potential. AC signals respectively flow through the coupling interconnection 42*e* to be coupled to the pad 51*e* as the output pad and the coupling interconnection 42*b* to be coupled to the pad 51*b* as the first resonator pad. Therefore, there is a possibility that these AC signals interfere with each other to deteriorate the noise performance. In the present embodiment, the second portion 422*a* of the coupling interconnection 42*a* which exists between the coupling interconnection 42*b* and the coupling interconnection 42*e*, and which is supplied with the DC potential plays a role of a shield, and thus, it is possible to reduce the interference between these AC signals to reduce the deterioration of the noise performance.

Further, in the present embodiment, the coupling interconnection 42*d* includes the fourth portion 422*d* extending between the pad 51*c* and the pad 51*f* in the plan view. The coupling interconnection 42*d* is coupled to the pad 51*d* as the control pad, and is supplied with a DC potential as the output control signal for the clock signal. Thus, similarly to the second portion 422*a* of the coupling interconnection 42*a*, the fourth portion 422*d* of the coupling interconnection 42*d* plays a role of a shield between the coupling interconnection 42*c* and the coupling interconnection 42*f* to thereby reduce the interference between signals respectively flowing through the coupling interconnection 42c and the coupling interconnection 42f to reduce the deterioration of the noise performance.

(1-2) Method of Manufacturing Oscillator:

An example of a method of manufacturing the oscillator 1 will be described.

First, the bump members 46 are formed on the respective pads 51 of the IC 50 with ultrasonic bump bonding using Au fine bonding wires.

Then, a bonding step of bonding the IC 50 to the IC arrangement surface 11c of the package 15 will be described. The IC 50 is flipped, and is passed to a tip nozzle of an ultrasonic horn of a flip chip bonding apparatus. Then, using the flip chip bonding apparatus, the surface of the IC 50 on which the pads 51 are disposed is made opposed in parallel to the IC arrangement surface 11c of the package 15 disposed horizontally with the mounting surface located in the bottom part. On this occasion, it is arranged that each of the pads 51 overlaps any one of the external terminals 44 in the plan view. Thus, in the oscillator 1, each of the bump members 46 is located at a position overlapping any one of the external terminals 44 in the plan view.

Then, using the flip chip bonding apparatus, the IC 50 is moved downward to come closer to the IC arrangement surface 11c. When the bump members 46 provided to the respective pads 51 of the IC 50 make contact with the corresponding coupling interconnections 42 on the IC arrangement surface 11c, and the flip chip bonding apparatus detects the load thereof, a predetermined load is applied to each of the bump members, and at the same time, an ultrasonic wave is applied thereto to bond the bump members 46 and the corresponding coupling interconnections 42 to each other. The condition of the ultrasonic wave is set as the power of the ultrasonic wave and the time for which the ultrasonic wave is applied. Further, appropriate heat is also required for the bonding. For example, predetermined heat (e.g., 150° C. through 200° C.) is applied to the package 15 in advance. Further, substantially the same heat is also applied to the package 15 during the ultrasonic processing.

Then, the resonator 20 is coupled and fixed to the coupling interconnections 41 on the resonator support surface of the package 15 with an electrically-conductive adhesive. Then, an annealing treatment is performed at high temperature on the whole of the package 15 in which the IC 50 and the resonator 20 are disposed including curing of the electrically-conductive adhesive. This also provides an advantage of removing an outgas from the electrically-conductive adhesive, the package 15, and so on. Then, the lid 16 made of metal is aligned with and fixed to the seam ring 14 of the package 15 and is then airtightly sealed using seam weld.

In such a manner, the oscillator 1 is manufactured.

(2) Second Embodiment (2-1) Configuration of Oscillator:

An oscillator 1a according to the present embodiment will be described. The oscillator 1a according to the present embodiment is substantially the same as the oscillator 1 according to the first embodiment except the point that the shapes of the external terminals 44a through 44d are different. The point in which the oscillator 1a and the oscillator 1 are different will be described.

Figure 6:
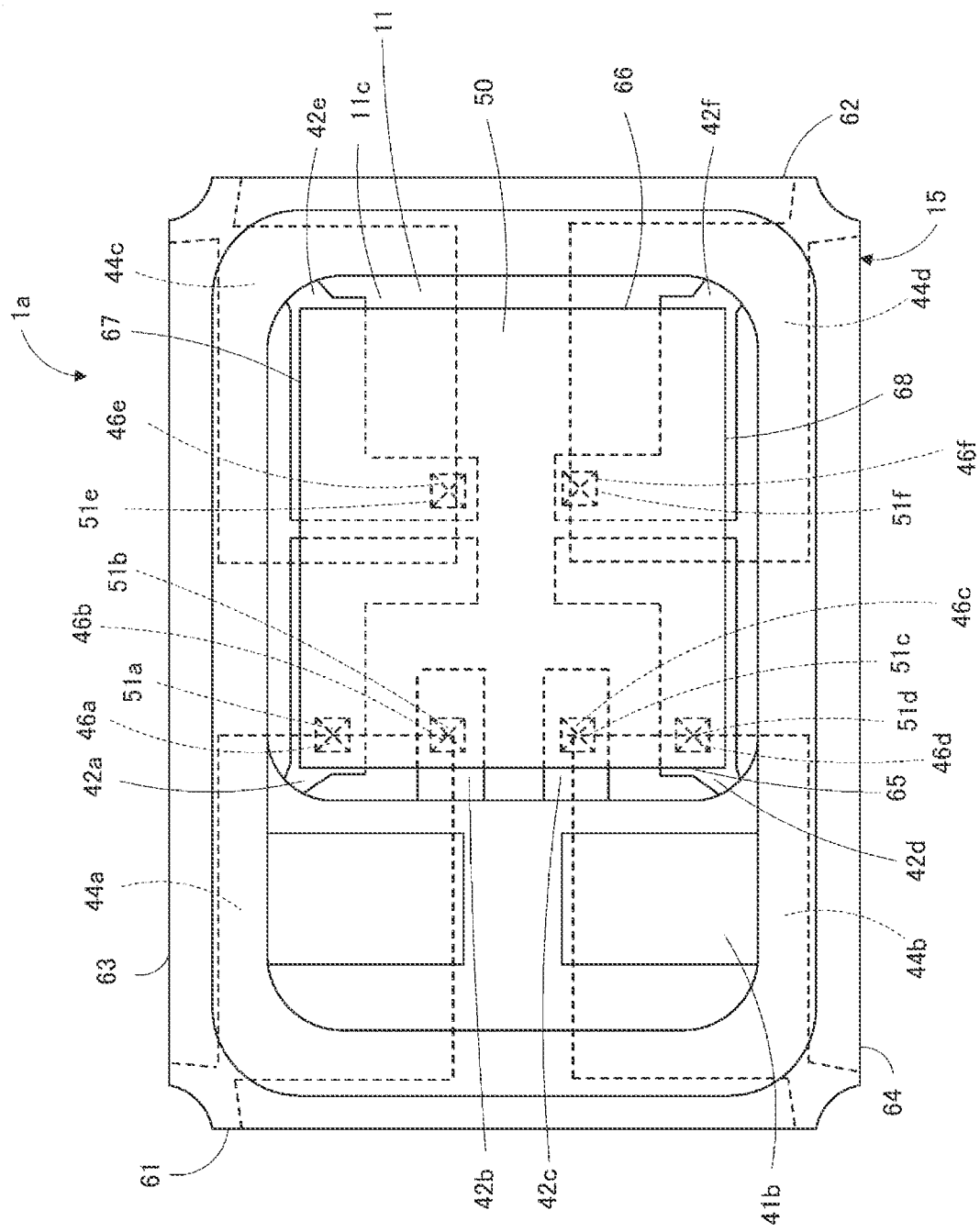
FIG. 6 is a see-through plan view of an oscillator.

FIG. 6 is a plan view of the oscillator 1a seen through the lid 16 and the resonator 20.

The external terminals 44a through 44d each have a shape including an area having a rectangular shape, and an area for coupling this area and a corner portion of the second surface 11b to each other. The area having a rectangular shape in the plan view in each of the external terminals 44a through 44d is smaller in width in the horizontal direction and the depth direction than the rectangular shape in the plan view in each of the external terminals 44a, 44c, and 44d in the first embodiment.

In the present embodiment, each of the pads 51 partially overlaps any one of the external terminals 44. Specifically, the pads 51a, 51b partially overlap the external terminal 44a, the pads 51c, 51d partially overlap the external terminal 44b, the pad 51e partially overlaps the external terminal 44c, and the pad 51f partially overlaps the external terminal 44d. Therefore, each of the bump members 46 is disposed at a position where the bump member 46 partially overlaps any one of the external terminals 44.

As described hereinabove, due to the configuration of the present embodiment, in the oscillator 1a, each of the pads partially overlaps any one of the external terminals 44 in the plan view. Therefore, the imbalance in height of the arrangement positions of the pads 51a through 51f on the IC arrangement surface 11c is reduced compared to when some of the plurality of pads of the IC overlap the external terminals 44, and the rest of the pads do not even partially overlap the external terminals 44 as in the oscillator 2. Thus, the pressure applied to the periphery of each of the pads 51a through 51f when bonding the IC 50 and the package 15 to each other using the flip chip bonding becomes more approximate to the uniform pressure. As a result, it is possible to reduce the possibility that an excessive pressure is applied to the periphery of some of the pads 51a through 51f to deteriorate the performance of the IC 50.

In the present embodiment, each of the pads 51 partially overlaps any one of the external terminals 44. Further, in the first embodiment, each of the pads 51 overlaps any one of the external terminals 44. It should be noted that it is also possible to adopt a configuration in which the oscillator 1a is configured so that some of the pads 51 overlap any one of the external terminals 44, and the rest of the pads 51 partially overlap any one of the external terminals 44. In this case, at least some of the pads 51 overlap the external terminals 44. Thus, it is possible to reduce the imbalance in height of the arrangement positions of the pads 51a through 51f on the IC arrangement surface 11c to reduce the possibility that the performance of the IC 50 deteriorates compared to when some of the plurality of pads 51 overlap the external terminals 44, and the rest of the pads 51 do not even partially overlap the external terminals 44.

(2-2) Method of Manufacturing Oscillator:

A method of manufacturing the oscillator 1a will be described.

First, the bump members 46 are formed on the respective pads 51 of the IC 50 using substantially the same method as the method of manufacturing the oscillator 1 according to the first embodiment.

Then, the IC 50 is flipped, and is passed to the tip nozzle of the ultrasonic horn of the flip chip bonding apparatus. Then, using the flip chip bonding apparatus, the surface of the IC 50 on which the pads 51 are disposed is made opposed in parallel to the IC arrangement surface 11c of the package 15 disposed horizontally with the mounting surface located in the bottom part. On this occasion, it is arranged that each of the pads 51a through 51f partially overlaps any one of the external terminals 44 in the plan view. Thus, in the oscillator 1a, each of the bump members 46 is located at a position partially overlapping any one of the external terminals 44 in the plan view.

Then, using the flip chip bonding apparatus, the IC 50 is moved downward to come closer to the IC arrangement surface 11*c*. When the bump members 46 provided to the respective pads 51 of the IC 50 make contact with the corresponding coupling interconnections 42 on the IC arrangement surface 11*c*, and the flip chip bonding apparatus detects the load thereof, a predetermined load and an ultrasonic wave are applied thereto to bond the bump members 46 and the corresponding coupling interconnections 42 to each other.

Then, using substantially the same method as the method of manufacturing the oscillator 1 according to the first embodiment, the resonator 20 is coupled and then fixed to the coupling interconnections 41, the lid 16 is aligned with and then fixed to the seam ring 14 of the package 15, and is then airtightly sealed with the seam weld.

In such a manner, the oscillator 1*a* is manufactured.

(3) Third Embodiment (3-1) Configuration of Oscillator:

An oscillator 1*b* according to the present embodiment will be described. The oscillator 1*b* according to the present embodiment is substantially the same as the oscillator 1 according to the first embodiment except the point that the shapes of the external terminals 44 are different in the plan view, and except the positions of the pads 51*e*, 51*f* in the IC 50. The point in which the oscillator 1*b* and the oscillator 1 are different will be described.

Figure 7:
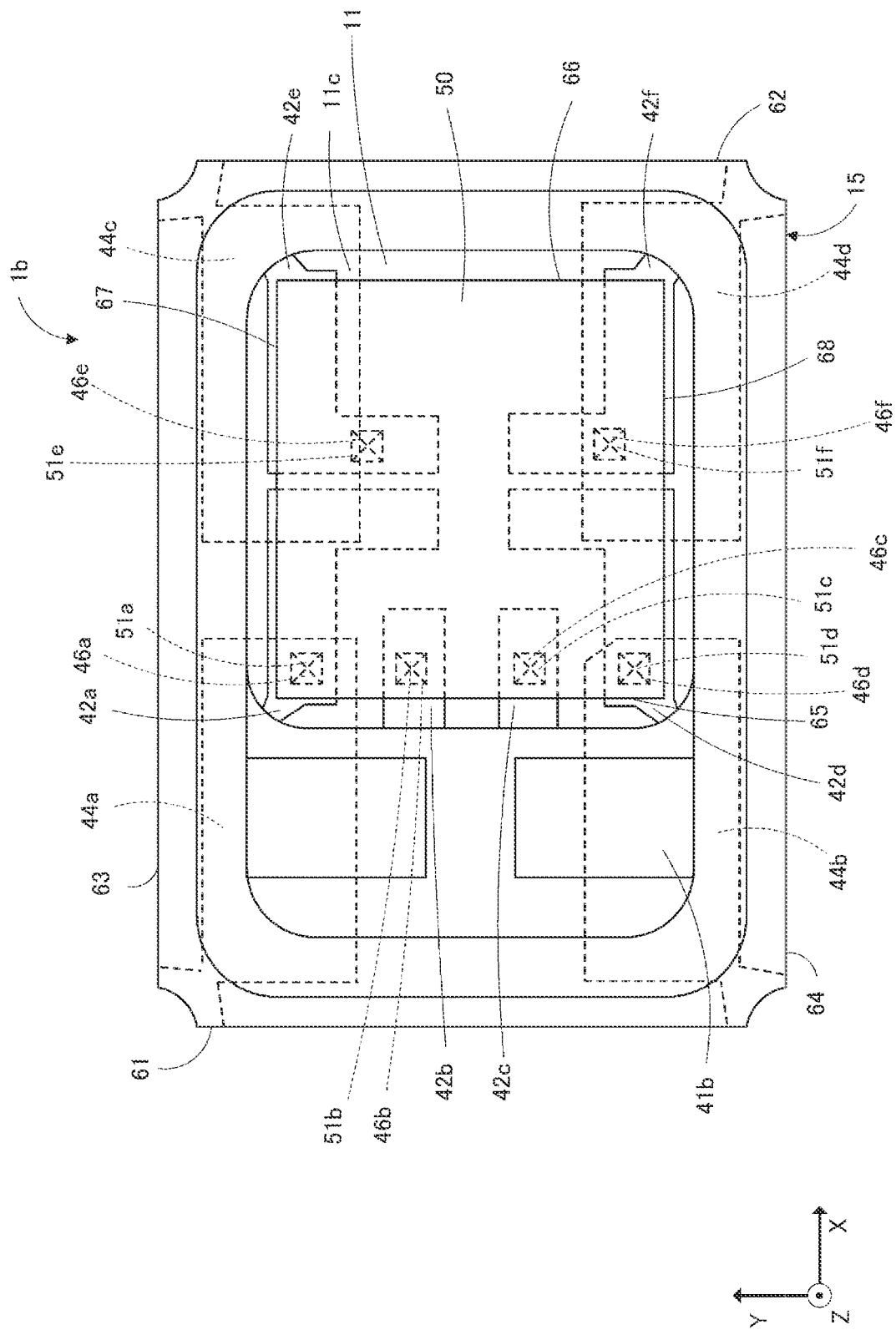
FIG. 7 is a see-through plan view of an oscillator.

FIG. 7 is a plan view of the oscillator 1*b* seen through the lid 16 and the resonator 20.

The external terminals 44*a* through 44*d* in the present embodiment are each smaller in width in the depth direction of the shape in the plan view compared to the external terminals 44*a* through 44*d* in the first embodiment.

The pad 51*e* in the present embodiment is disposed at the back side compared to the pad 51*e* in the first embodiment, and the pad 51*f* in the present embodiment is disposed at the front side compared to the pad 51*f* in the first embodiment. In other words, the pads 51*e*, 51*f* in the present embodiment are disposed so as to get away from the center in the depth direction in the IC 50 compared to the pads 51*e*, 51*f* in the first embodiment.

As shown in FIG. 7, in the present embodiment, the pad 51*a* overlaps the external terminal 44*a* in the plan view. Further, the pad 51*d* overlaps the external terminal 44*b* in the plan view. Further, the pad 51*e* partially overlaps the external terminal 44*c* in the plan view. Further, the pad 51*f* overlaps the external terminal 44*d* in the plan view. Further, the pads 51*b*, 51*c* overlap none of the external terminals 44 in the plan view. In other words, in the present embodiment, each of the pads 51 the closest to the four corners of the IC 50 out of the pads 51 at least partially overlaps any one of the external terminals 44.

As described hereinabove, due to the configuration of the present embodiment, each of the pads 51*a*, 51*d*, 51*e*, and 51*f* at least partially overlaps any one of the external terminals 44 in the plan view. Therefore, the imbalance in height of the arrangement positions of the pads 51*a*, 51*d*, 51*e*, and 51*f* on the IC arrangement surface 11*c* is reduced. When bonding the IC 50 to the package 15 using the flip chip bonding, the bump members 46*a*, 46*d*, 46*e*, and 46*f* in the pads 51*a*, 51*d*, 51*e*, and 51*f* make contact with the coupling interconnections 42 on the IC arrangement surface 11*c* before the bump members 46*b*, 46*c* in the pads 51*b*, 51*c* make contact with the coupling interconnections 42 on the IC arrangement surface 11*c*. In this case, the bump members 46*a*, 46*d*, 46*e*, and 46*f* receive the force applied as a result. The bump members 46*a*, 46*d*, 46*e*, and 46*f* are not disposed in alignment with each other, and the force applied is received by a plane including the respective positions of the bump members 46*a*, 46*d*, 46*e*, and 46*f*. Thus, it is possible to more stably receive the force applied compared to when receiving the force applied with a point, namely a single bump 46, and when receiving the force applied with a line, namely the bump members 46 in alignment with each other. As a result, it is possible to reduce the possibility that the performance of the IC deteriorates.

In the present embodiment, it is assumed that each of the pads 51*a*, 51*d*, 51*e*, and 51*f* the closest to the four corners of the IC 50 at least partially overlaps the external terminal 44. It should be noted that it is possible to arrange that three of the pads 51*a*, 51*d*, 51*e*, and 51*f* the closest to the four corners of the IC 50 each at least partially overlap the external terminal 44. The three of the pads 51*a*, 51*d*, 51*e*, and 51*f* the closest to the four corners of the IC 50 are not disposed in alignment with each other, and these three pads 51 can form a plane. Therefore, when bonding the IC 50 to the package 15 using the flip chip bonding, it is possible for the three bump members 46 in these three pads 51 to receive the force applied as the plane formed by the three points of these three bump members 46. As a result, it is possible to reduce the possibility that an excessive pressure is applied to the periphery of some of the pads 51*a* through 51*f* to deteriorate the performance of the IC 50.

Figure 8:
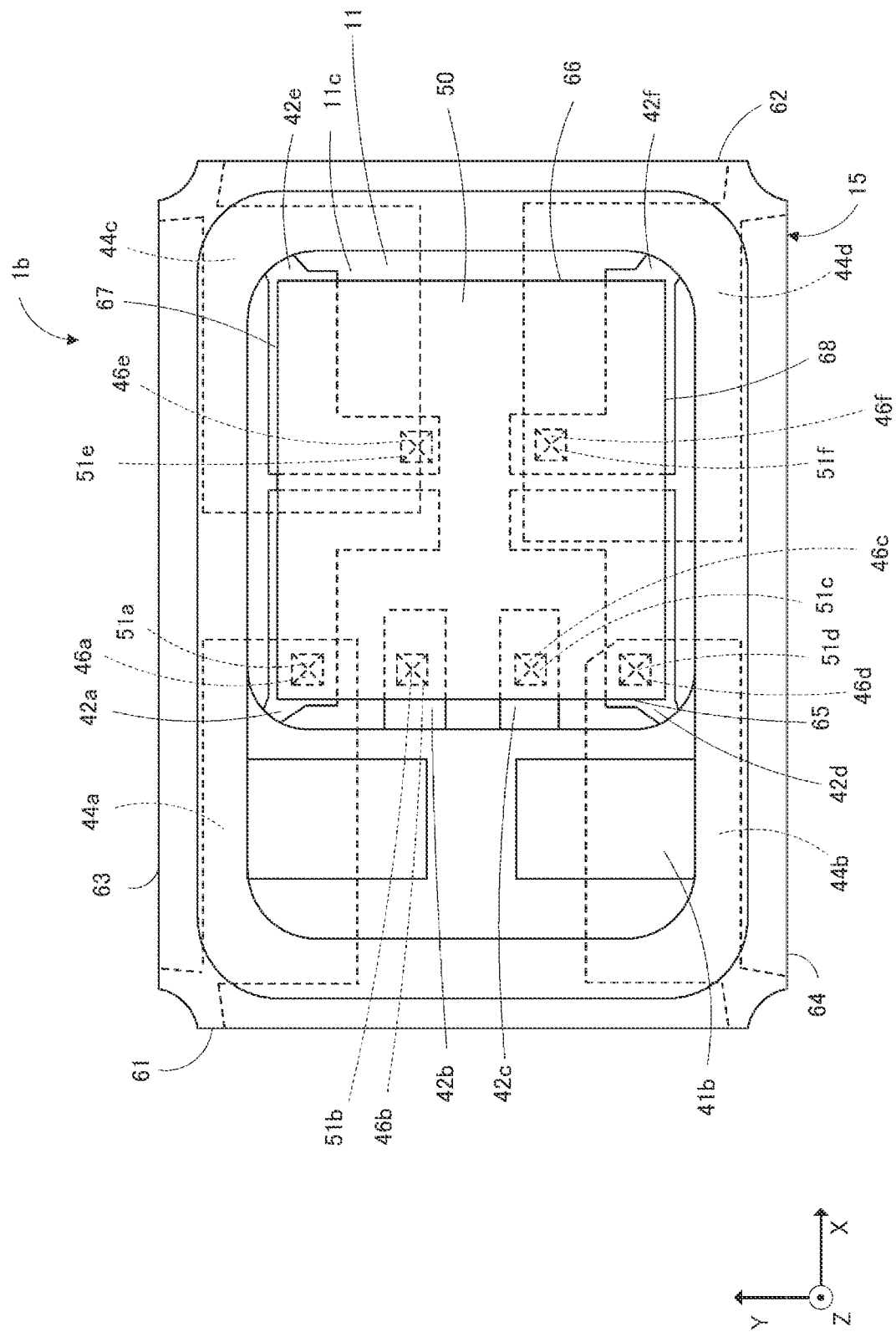
FIG. 8 is a see-through plan view of an oscillator.

Further, the shapes of the external terminals 44*c*, 44*d* as the external terminals 44 closer to the second pad group (the pads 51*e*, 51*f*) than to the first pad group (the pads 51*a* through 51*d*) in the present embodiment are not limited to the shapes shown in FIG. 7. For example, it is possible to adopt a shape larger in width in the depth direction compared to the external terminals 44*a*, 44*b* closer to the first pad group (the pads 51*a* through 51*d*) than to the second pad group (the pads 51*e*, 51*f*) as shown in FIG. 8. Thus, it is possible to make the external terminals 44*c*, 44*d* at least partially overlap the pads 51*e*, 51*f* even when the pads 51*e*, 51*f* are disposed so as to be shifted toward the center in the depth direction on the IC 50 as shown in FIG. 8.

(3-2) Method of Manufacturing Oscillator:

A method of manufacturing the oscillator 1*b* will be described.

First, the bump members 46 are formed on the respective pads 51 of the IC 50 using substantially the same method as the method of manufacturing the oscillator 1 according to the first embodiment.

Then, the IC 50 is flipped, and is passed to the tip nozzle of the ultrasonic horn of the flip chip bonding apparatus. Then, using the flip chip bonding apparatus, the surface of the IC 50 on which the pads 51 are disposed is made opposed in parallel to the IC arrangement surface 11*c* of the package 15 disposed horizontally with the mounting surface located in the bottom part. On this occasion, it is arranged that the pads 51*a*, 51*d*, 51*e*, and 51*f* partially overlap the external terminals 44*a*, 44*b*, 44*c*, and 44*d*, respectively, in the plan view. Further, it is also arranged that the pads 51*b*, 51*c* overlap none of the external terminals 44. Thus, in the oscillator 1*b*, each of the bump members 46*a*, 46*d*, 46*e*, and 46*f* is located at a position partially overlapping any one of the external terminals 44 in the plan view. Further, each of the bump members 46*b*, 46*c* is located at a position overlapping none of the external terminals 44.

Then, using the flip chip bonding apparatus, the IC 50 is moved downward to come closer to the IC arrangement surface 11*c*. When the bump members 46 provided to the respective pads 51 of the IC 50 make contact with the corresponding coupling interconnections 42 on the IC arrangement surface 11c, and the flip chip bonding apparatus detects the load thereof, a predetermined load and an ultrasonic wave are applied thereto to bond the bump members 46 and the corresponding coupling interconnections 42 to each other.

Then, using substantially the same method as the method of manufacturing the oscillator 1 according to the first embodiment, the resonator 20 is coupled and then fixed to the coupling interconnections 41, the lid 16 is aligned with and then fixed to the seam ring 14 of the package 15, and is then airtightly sealed with the seam weld.

In such a manner, the oscillator 1b is manufactured.

(4) Other Embodiments

The embodiments described hereinabove are each an example for implementing the present disclosure. Besides the above, it is possible to adopt a variety of embodiments which adjust at least one of the positions of the respective pads 51 in the IC 50, and the positions or the shapes of the external terminals 44 to make each of the pads 51 including at least three of the pads 51 the closest to the four corners of the IC 50 at least partially overlap any one of the external terminals 44 in the plan view.

In each of the embodiments described above, it is assumed that the pads 51a through 51f play roles of the power supply pad, the first resonator pad, the second resonator pad, the control pad, the ground pad, and the output pad, respectively. It should be noted that it is also possible to assume that the pads 51a through 51f each play a different role. For example, the pad 51a can be the control pad, and the pad 51d can be the power supply pad. Further, it is possible for the coupling interconnections 42a through 42f and the external terminals 44a through 44f to play roles different from those in each of the embodiments described above in accordance with the roles of the pads 51a through 51f, respectively.

Further, in each of the embodiments described above, it is assumed that the quartz crystal resonator is used as the resonator 20. It should be noted that it is possible to assume that a different type of resonator such as a ceramic resonator is used as the resonator 20.

Further, in each of the embodiments described above, it is assumed that the pad 51 overlapping the external terminal 44 at least partially overlaps one of the external terminals 44. It should be noted that it is possible to adopt a configuration in which the pad 51 overlapping the external terminal 44 at least partially overlaps two or more of the external terminals 44.

Further, in the third embodiment described above, it is assumed that the pads 51b, 51c out of the pads 51 do not overlap the external terminals 44. The portion overlapping the external terminal 44 in the plan view on the IC arrangement surface 11c becomes higher than the periphery. Further, regarding a portion not overlapping the external terminal 44 in the plan view on the IC arrangement surface 11c, the closer to the external terminal 44 it is located, the higher it becomes, and the farther from the external terminal 44 it is located, the lower it becomes due to an influence of the external terminal 44. Therefore, regarding the pads 51 not overlapping the external terminals 44, by setting the arrangement positions within a range in which the distance from the external terminals 44 is equal to or shorter than a predetermined distance in the plan view, it is possible to further reduce the imbalance in height of the arrangement positions of the pads 51a through 51f on the IC arrangement surface 11c. The distance mentioned here is the shortest distance between an outer edge of the external terminal 44 and an outer edge of the pad 51. Therefore, when a part of the pad 51 overlaps the external terminal 44, the distance between the external terminal 44 and the pad 51 becomes 0. As the predetermined distance, there are cited, for example, a distance twice as large as the width of the pad 51 and a distance three times as large as the width of the pad 51.

Further, in each of the embodiments described above, it is assumed that the four pads 51 (51a through 51d) are included in the first pad group, and the two pads 51 (51e and 51f) are included in the second pad group. It should be noted that the numbers of the pads 51 included in the first pad group and the second pad group are not limited thereto. For example, it is possible to assume that three pads 51 are included in each of the first pad group and the second pad group.

It is sufficient for the external terminals and the package to be arranged that a part of the surface on which the circuit element is disposed in the package overlaps the external terminals.

It is sufficient for the circuit element to have a configuration in which each of at least three of the pads on the four corners can be disposed so as to even partially overlap the external terminal.

What is claimed is:

1. An oscillator comprising:
   a package having a plurality of external terminals disposed on a mounting surface, the package being in a rectangular shape in a plan view and having a first side, a second side as an opposite side to the first side, a third side, and a fourth side as an opposite side to the third side in the plan view;
   a circuit element housed in the package, the circuit element being in a rectangular shape in the plan view and having a fifth side located beside the first side, a sixth side which is an opposite side to the fifth side, and is located farther from the first side than the fifth side, a seventh side, and an eighth side as an opposite side to the seventh side in the plan view; and
   a resonator which is housed in the package, and is electrically coupled to the circuit element, wherein
   the circuit element is electrically coupled to the package with a plurality of pads which are bonded to the package via a plurality of bump members, respectively,
   at least three of closest bump members to four corners of the circuit element out of the plurality of bump members are bonded to the package at respective positions overlapping the plurality of external terminals in the plan view,
   the plurality of pads includes a first pad group disposed along the fifth side so as to be closer to the fifth side than to the sixth side, and a second pad group disposed along the sixth side so as to be closer to the sixth side than to the fifth side, and
   a distance between the first side and the fifth side is longer than a distance between the second side and the sixth side.

2. The oscillator according to claim 1, wherein
   each of the plurality of bump members is bonded to the package at a position overlapping at least one of the plurality of external terminals in the plan view.

3. The oscillator according to claim 1, wherein
   the external terminal closer to the second pad group than to the first pad group out of the plurality of external terminals is longer in length along the second side compared to the external terminal closer to the first pad group than to the second pad group out of the plurality of external terminals.

4. The oscillator according to claim 1, wherein
a distance between the fifth side and the first pad group is shorter than a distance between the sixth side and the second pad group.

5. The oscillator according to claim 1, wherein
the plurality of pads includes
a power supply pad to which a power supply voltage is applied,
a ground pad supplied with a ground potential,
a first resonator pad to be electrically coupled to the resonator,
a second resonator pad to be electrically coupled to the resonator,
an output pad configured to output a clock signal, and
a control pad to which an output control signal for the clock signal is input.

6. The oscillator according to claim 5, wherein
the package includes a power supply interconnection electrically coupled to the power supply pad, and
the power supply interconnection includes
a first portion configured to couple the power supply pad and a power supply terminal included in the plurality of external terminals, and
a second portion extending between the output pad and the first resonator pad in the plan view.

7. The oscillator according to claim 5, wherein
the package includes a control interconnection electrically coupled to the control pad, and
the control interconnection includes
a third portion configured to couple the control pad and a control terminal included in the plurality of external terminals, and
a fourth portion extending between the ground pad and the second resonator pad in the plan view.

8. A method of manufacturing an oscillator, the oscillator including:
a package having a plurality of external terminals disposed on a mounting surface, the package being in a rectangular shape in a plan view and having a first side, a second side as an opposite site side to the first side, a third side, and a fourth side as an opposite side to the third side in the plan view;
a circuit element housed in the package, the circuit element being in a rectangular shape in the plan view and having a fifth side located beside the first side, a sixth side which is an opposite side to the fifth side, and is located farther from the first side than the fifth side, a seventh side, and an eighth side as an opposite side to the seventh side in the plan view; and
a resonator which is housed in the package, and is electrically coupled to the circuit element,
the method comprising:
a bonding step of bonding each of a plurality of pads provided at the circuit element to the package via a plurality of bump members, respectively, thereby electrically couple the circuit element to the package, wherein
in the bonding step, at least three of closest bump members to four corners of the circuit element out of the plurality of bump members at least partially overlap the plurality of external terminals in the plan view,
the plurality of pads includes a first pad group disposed along the fifth side so as to be closer to the fifth side than to the sixth side, and a second pad group disposed along the sixth side so as to be closer to the sixth side than to the fifth side, and
a distance between the first side and the fifth side is longer than a distance between the second side and the sixth side.

9. An oscillator comprising:
a package having a plurality of external terminals disposed on a mounting surface;
a circuit element housed in the package, the circuit element being in a rectangular shape in a plan view; and
a resonator which is housed in the package, and is electrically coupled to the circuit element, wherein
the circuit element is electrically coupled to the package with a plurality of pads which are bonded to the package via a plurality of bump members, respectively,
at least three of closest bump members to four corners of the circuit element out of the plurality of bump members are bonded to the package at respective positions overlapping the plurality of external terminals in the plan view, and
the plurality of pads includes:
a power supply pad to which a power supply voltage is applied;
a ground pad supplied with a ground potential;
a first resonator pad to be electrically coupled to the resonator;
a second resonator pad to be electrically coupled to the resonator;
an output pad configured to output a clock signal; and
a control pad to which an output control signal for the clock signal is input.

* * * * *